(12) United States Patent
Ference et al.

(10) Patent No.: US 6,225,699 B1
(45) Date of Patent: May 1, 2001

(54) CHIP-ON-CHIP INTERCONNECTIONS OF VARIED CHARACTERISTICS

(75) Inventors: Thomas George Ference, Essex Junction; Wayne John Howell, Williston; Edmund Juris Sprogis, Underhill, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/105,477

(22) Filed: Jun. 26, 1998

(51) Int. Cl.[7] .................................................. H01L 23/48
(52) U.S. Cl. ............................ 257/777; 257/737; 257/778
(58) Field of Search ................................... 257/777, 685, 257/737, 778

(56) References Cited

U.S. PATENT DOCUMENTS

| | | |
|---|---|---|
| 4,703,483 | 10/1987 | Enomoto et al. . |
| 5,109,320 | 4/1992 | Bourdelaise et al. . |
| 5,323,060 | 6/1994 | Fogal et al. . |
| 5,399,898 | 3/1995 | Rostoker . |
| 5,401,672 | 3/1995 | Kurtz et al. . |
| 5,434,453 | 7/1995 | Yamamoto et al. . |
| 5,446,247 | 8/1995 | Cergel et al. . |
| 5,495,394 | 2/1996 | Kornfeld et al. . |
| 5,541,449 | 7/1996 | Crane, Jr. et al. . |
| 5,563,773 | 10/1996 | Katsumata . |
| 5,576,519 | 11/1996 | Swamy . |
| 5,600,541 | 2/1997 | Bone et al. . |
| 5,760,478 | * 6/1998 | Bozsco et al. ........................ 257/777 |

OTHER PUBLICATIONS

IBM Technical Discloure Bulletin, vol. 22 No. 10 Mar. 1980, High Performance Package with Conductive Bonding to Chips, Coombs, et al., 2 pages.
IBM Technical Disclosure Bulletin, vol. 14 No. 6 Nov. 1971, Chip Joining Process, Lavanant et al., 2 pages.
Interconnect Reliability of Ball Grid Array and Direct Chip Attach, Topic 2, Andrew Mawer, 17 pages.
IBM Technical Disclosure Bulletin, vol. 10 No. 5, Semiconductor Chip Joining, Miller et al., 2 pages.
IBM Technical Disclosure Bulletin, vol. 31 No. 2 Jul. 1988, Plastic Package for Semiconductors with Integral Decoupling Capacitor, Howard et al., 2 pages.
IBM Technical Disclosure Bulletin, vol. 36 No. 12 Dec. 1993, Postage Stamp Lamination Of Reworkable Interposers For Direct Chip Attach, pp. 487 and 488.

* cited by examiner

Primary Examiner—Carl Whitehead, Jr.
Assistant Examiner—Roy Potter
(74) Attorney, Agent, or Firm—Schmeiser, Olsen & Watts; Howard J. Walter, Jr.

(57) ABSTRACT

Chip-on-chip interconnections of varied characteristics, such as varied diameters, heights and/or composition, are disclosed. A first chip-on-chip interconnection on a joining plane has a first characteristic (e.g., a first height) and a second chip-on-chip interconnection on the same joining plane has a second characteristic (e.g., a second height greater than the first height). The first and second characteristics of the chip-on-chip interconnections allow for chip-on-chip connections to other packages, substrates or chips of different levels and/or compositions.

32 Claims, 6 Drawing Sheets

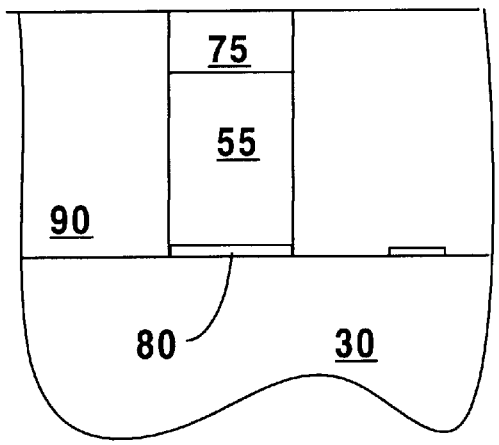
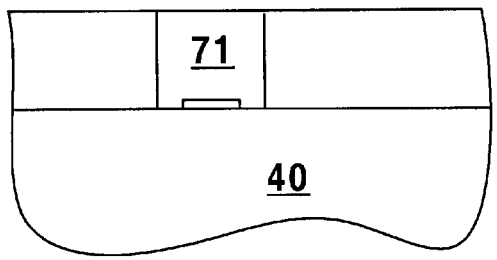
FIG. 8  FIG. 9
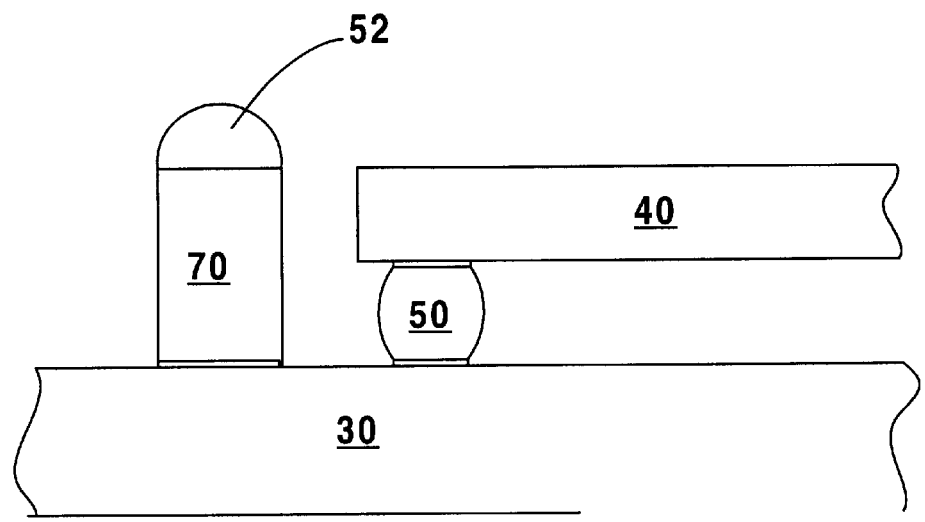
FIG. 10

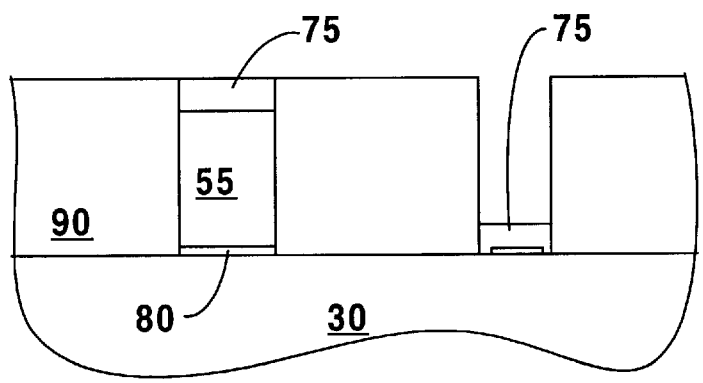
FIG. 11
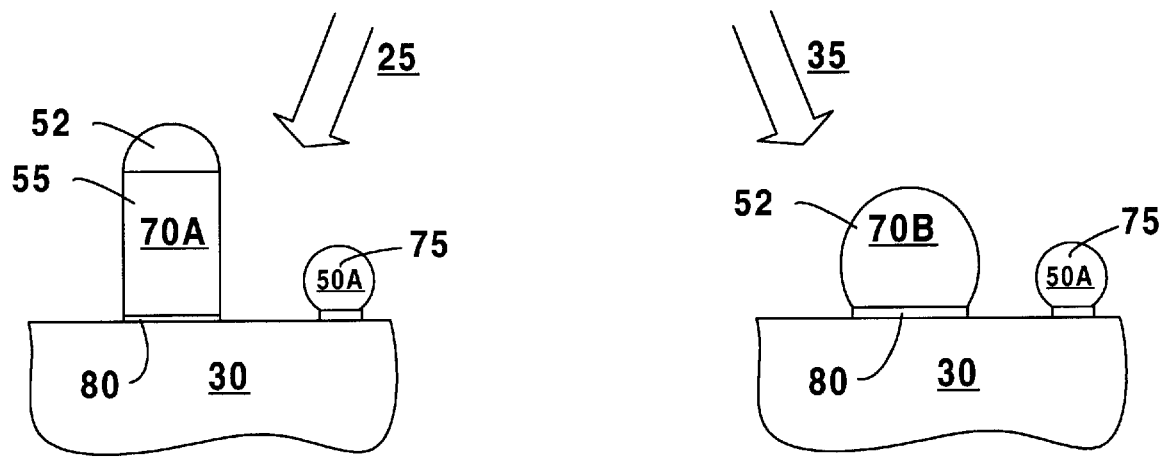
FIG. 12
FIG. 13

CHIP-ON-CHIP INTERCONNECTIONS OF VARIED CHARACTERISTICS

RELATED APPLICATIONS

This application is related to two co-pending applications: U.S. Ser. No. 09/105,382 entitled "Micro-flex Technology in Semiconductor Packages", by Bertin et al; and U.S. Ser. No. 09/105,419 entitled "Highly Integrated Chip-on-Chip Packaging", by Bertin et al. The related applications are assigned to the assignee of record, are filed concurrently herewith, and are herein incorporated by reference.

BACKGROUND OF THE INVENTION

1. Technical Field

The invention relates generally to semiconductor devices, and more specifically, to chip-on-chip interconnections in semiconductor devices.

2. Background Art

In the past, semiconductor devices built with different technologies were fabricated on separate wafers, diced, and then connected together by mounting the devices on a substrate. Recently, the merging of DRAM and logic, and other dissimilar semiconductor technologies has been headed towards connecting one chip directly to another chip through solder ball connections, such as C4 (controlled collapse chip connection) connections. This structure, known as a face-to-face chip-on-chip (chip 1/chip2) structure, provides a large number of I/O's between the two chips and is shown in the following IBM Technical Disclosure Bulletins: Vol. 28 No. 2, July 1985 "Mated Array Chip Configuration", pgs. 811–812; and Vol. 25 No. 10, March 1983 "Chip-On-Chip Module for Assembly" by Spector et al., pgs. 5315–5316. Although the chip1/chip2 structure of the aforementioned bulletins and other similar structures are joined through C4 technology, there is a limit to how the connections can be made between the chips as well as connections made to the outside package. Thus, other chip-on-chip connections, such as wirebonding, are necessary to connect the chip1/chip2 structure to other chips or to the outside package. These other connections may not be as easily manufactured or as durable as the C4 solder ball connection.

SUMMARY OF THE INVENTION

It is thus an advantage of the present invention to provide chip-on-chip interconnections of varied characteristics that eliminate the above described limitations.

The advantages of the invention are realized by chip-on-chip interconnections (e.g., C4 interconnections, solder ball interconnections, polymer-metal composite interconnections, plated copper columns, micro-velcro connections, etc.) of varied diameters, heights and/or composition, allowing for connections between devices and substrates at different levels or composition. That is, a first chip-on-chip interconnection on a joining plane has a first characteristic (e.g, a first height) and a second chip-on-chip interconnection on the same joining plane has a second characteristic (e.g., a second height greater than the first height). The first and second characteristics of the chip-on-chip interconnections allow for a first and second chip-on-chip connection to other packages, substrates or chips.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and:

FIGS. 8, 9 and 10 are cross-sectional views showing a fabrication sequence of the chip-on-chip interconnections of FIG. 1 in accordance with a second embodiment of the present invention;

FIGS. 11, 12 and 13 are cross-sectional views showing a fabrication sequence of the chip-on-chip interconnections of FIG. 1 in accordance with a third and fourth embodiment of the present invention.

DETAILED DESCRIPTION OF THE DRAWINGS

Figure 1:
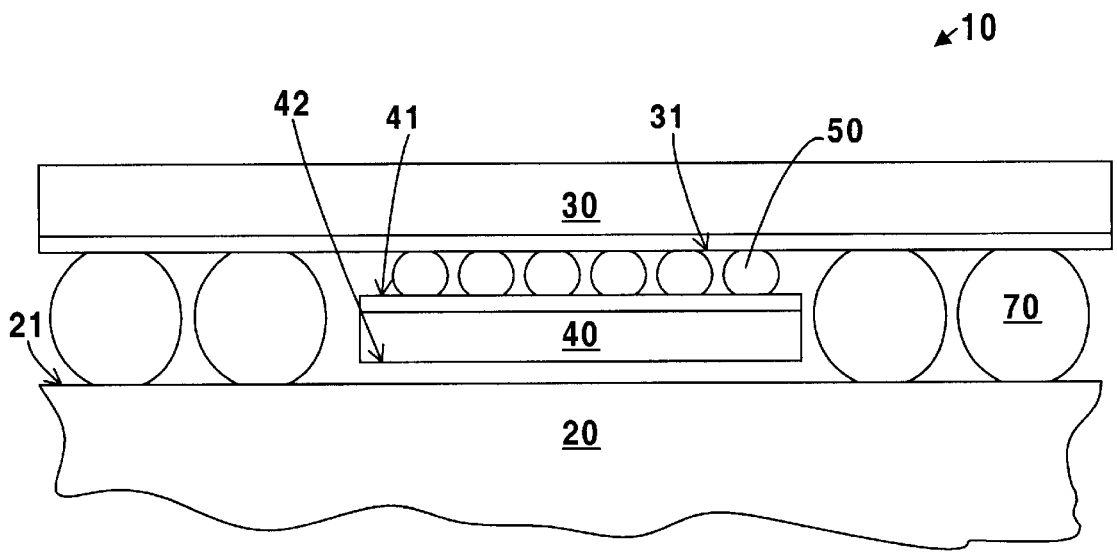
FIG. 1 is an exemplary semiconductor package using chip-on-chip interconnections in accordance with a preferred embodiment of the present invention.

Referring to FIG. 1, a cross-sectional diagram of an exemplary semiconductor package 10 having a first chip-on-chip interconnection 50 and a second chip-on-chip interconnection 70 in accordance with a preferred embodiment of the present invention is shown. A chip1/chip2 structure is shown with the face 41 of one chip (chip1) 40 connecting directly to the face 31 of a second chip (chip2) 30. The first chip-on-chip interconnection 50 facilitates the connection of chip 40 to chip 30. The second chip-on-chip interconnection 70, which is of a different characteristic than the first chip-on-chip interconnection 50, facilitates the joining of chip 30 and the assembly to a package, substrate, or third chip 20 having planar surface 21 that is substantially parallel with the face 41 of chip1 40 and substantially parallel with the face 31 of chip2 30. There is inherently a chip-thickness between the planar face surface 41 of chip1 40 and the planar back surface 42 of chip1 40. The planar surface 21 of the package, substrate, or third chip 20, is continuous where it is adjacent to chip1 40 and chip2 30. Such varied characteristics of the chip-on-chip interconnections include, but are not limited to, height, diameter, composition, or a combination thereof. Thus, the present invention provides chip-on-chip interconnections of different diameters, heights and/or composition all on the same joining plane (e.g., chip 30 in this example); allowing for connections between devices and substrates at different levels and/or compositions. Although a chip1/chip2 structure is specifically shown for this example, it is to be understood that other chip, substrate and package structures may be used that could benefit from the chip-on-chip interconnections of the present invention. Furthermore, the chip-on-chip interconnections of the present invention preferably consist of solder balls and solder columns, but are not limited to such. Other conductive interconnections may be used such as polymer-metal composite interconnections, plated copper columns, micro-velcro connections, etc.

Figure 2:
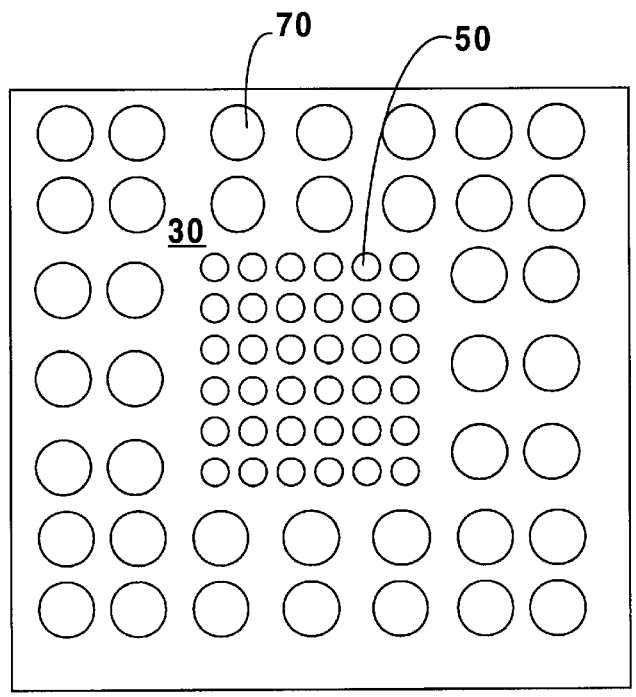
FIG. 2 is a planar view of the chip-on-chip interconnections of FIG. 1.

A planar view of the chip-on-chip layout of FIG. 1 is shown in FIG. 2. As aforementioned, the first chip-on-chip interconnection 50 is shown that has a different characteristic than the second chip-on-chip interconnection 70. The chip-on-chip interconnections may differ in diameter, height and/or composition, whatever is necessary to achieve the desired joining between the multiple levels of devices. In embodiments of the invention, as in FIG. 1 and FIG. 14, wherein a chip1/chip2 structure is joined to a third chip/substrate 20, the height of the second chip-on-chip interconnection is not less than a sum of the chip-thickness plus the height of the first chip-on-chip interconnection.

FIGS. 3–7 illustrate an exemplary fabrication sequence of the first and second chip-on-chip interconnections of FIG. 1. For this, and subsequent examples, the chip-on-chip interconnections will be described as a controlled collapse chip connection (C4), but will not be limited to such. Also, although in this example, the resulting C4 interconnections vary from each other in height, diameter and composition, the interconnections could easily vary only in height, diameter, composition or combinations thereof depending upon the fabrication process employed. The variations of the chip-on-chip interconnections are achievable through a plating process, as will be seen in the subsequent examples.

Figure 3:
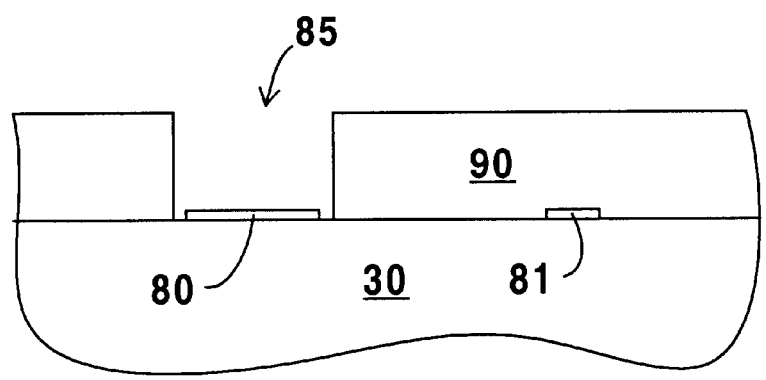
FIGS. 3, 4, 5, 6 and 7 are cross-sectional views showing a fabrication sequence of the chip-on-chip interconnections of FIG. 1 in accordance with a first embodiment of the present invention.
Figure 4:
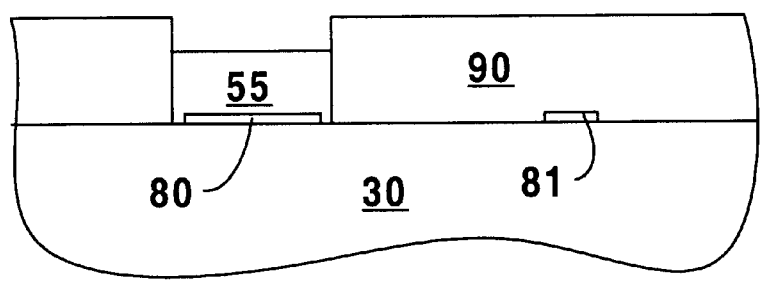
Figure 5:
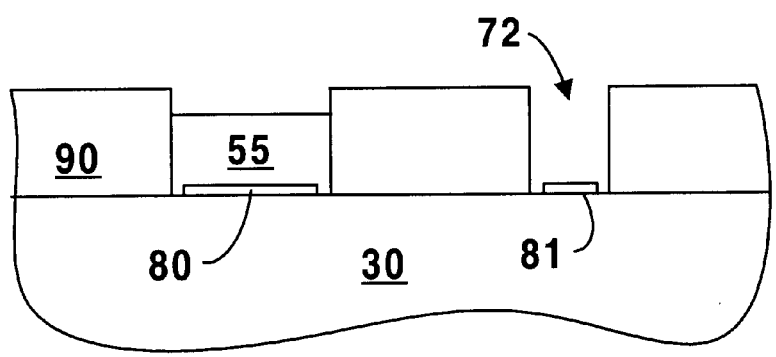
Figure 6:
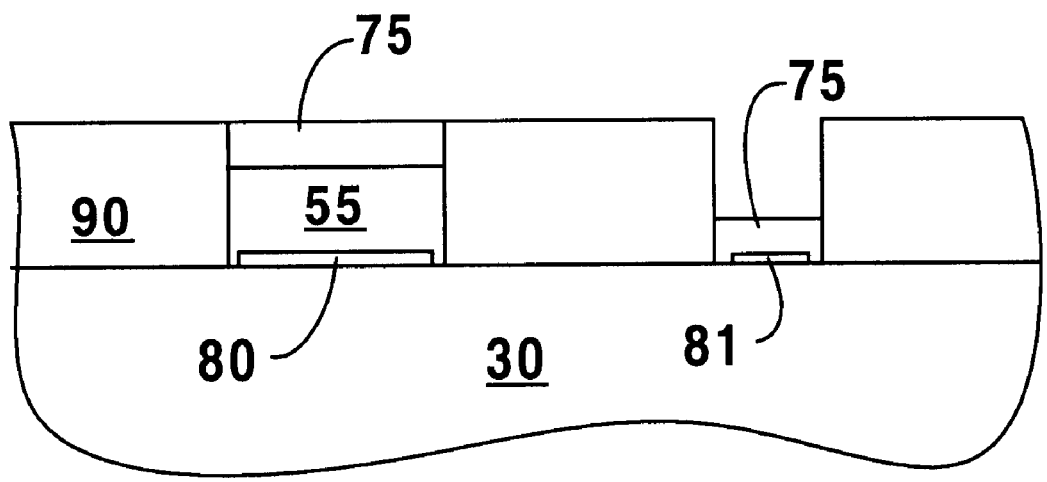
Figure 7:
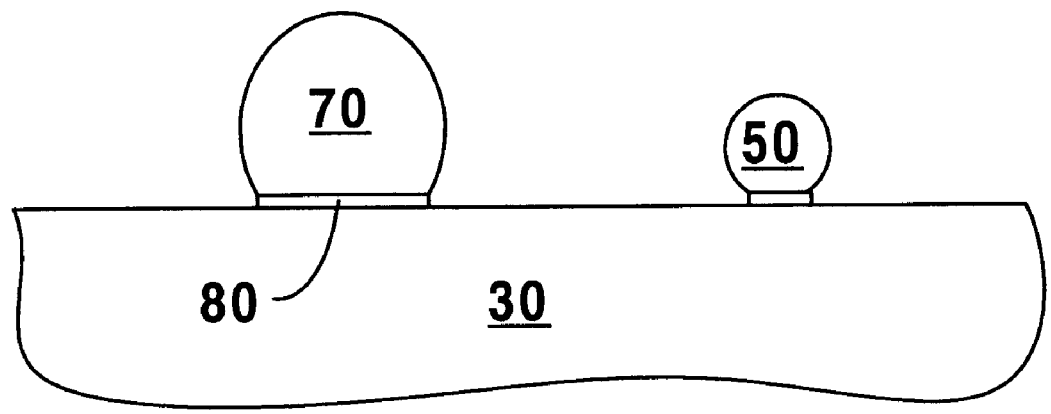

FIG. 3 illustrates the first step in the fabrication sequence for the first and second chip-on-chip interconnections of FIG. 1. A plating mask 90 is laid over chip 30. An opening 85, over the C4 pad 80 that will be plated to, is defined through a process such as photolithography. The height of plating mask 90 determines the height of the tallest C4 interconnection and the combined size of opening 85 and C4 pad diameter 80 determines the diameter of the C4 interconnection for C4 pad 80. As can be seen in FIG. 4, a partial plating of the pad is accomplished using one composition of solder 55. A second opening 72 is then photolithographically-defined over a second C4 pad 81, as illustrated in FIG. 5. The combined width of the second opening 72 and C4 pad diameter 81 determines the diameter of the second C4 interconnection. As seen in FIG. 6, both pads then have an additional solder of a second composition 75 plated on. After the plating mask 90 is stripped and the solder 55 and 75 reflowed, the structure left is that of two different size (height and diameter) and different composition C4 interconnections 70 and 50 as seen in FIG. 7. The two varied C4 structures on chip 30 may then be used to join chip 30 to chip 40 and substrate/package 20 to produce the structure of FIG. 1. Although the process shown is done on the same chip 30, different C4 interconnections may be fabricated on separate chips or other joining planes and then applied together to achieve a similar structure such as the one shown in FIG. 1.

As aforementioned, the structure in FIG. 1 may be fabricated alternatively by forming the different size C4 connections on separate chips and then joining them together, as shown in FIGS. 8–10. This process eliminates the need for a two step masking sequence described in FIGS. 3–7. FIG. 8 illustrates the method of forming a large solder ball or column over a C4 pad through a masked opening on chip 30. In this example, a column is plated with a first composition 55 and a second composition 75, the first composition 55 having a higher reflow temperature than the second composition 75. The mask covers a smaller C4 pad to be used for the C4 connection pad to chip 40 (FIG. 9). FIG. 9 shows the formation of a smaller conventional C4 ball on chip 40 also using a mask. This C4 connection is plated with a third composition 71, which has a lower reflow temperature than the first composition 55, but a higher reflow temperature than the second composition 75. As seen in FIG. 10, chip 30 is then joined to chip 40 with the small C4 connections 50 on chip 40 connecting to the C4 pad on chip 30. The joined assembly can then be joined using the larger C4 connections or column on chip 30 to a carrier, substrate, or third chip, through intermediate composition 52, as shown in FIG. 1.

FIGS. 11–13 illustrate how a solder column or solder bump structure may be formed from the same set of plated C4 interconnections of differing compositions (FIG. 11) depending on the reflow temperature. FIG. 11 is fabricated similar to steps shown in FIGS. 3–6, producing a first plated C4 interconnection with a first composition 55 and a second composition 75, and a second plated C4 interconnection with only a second composition 75. As seen in FIG. 12, after the mask is stripped and through a low temperature reflow 25, a first C4 interconnection 70A is formed having a column of a first composition 55 and a top portion of an intermediate composition 52. The second C4 interconnection 50A is composed of the second composition 75. In FIG. 13, a high temperature reflow 35 produces a first C4 interconnection 70B of an intermediate composition 52, the intermediate composition 52 being of a composition level between the first composition 55 and the second composition 75. Again, the second C4 interconnection 50A is composed of the second composition 75.

Figure 14:
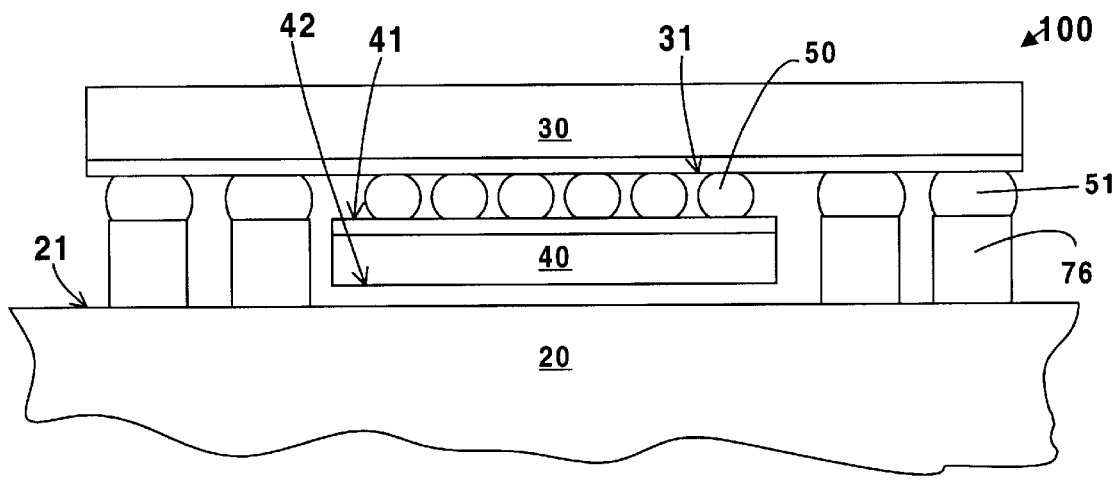
FIGS. 14 and 15 are exemplary cross-sectional views of semiconductor packages using the chip-on-chip interconnections in accordance with an embodiment of the present invention.
Figure 15:
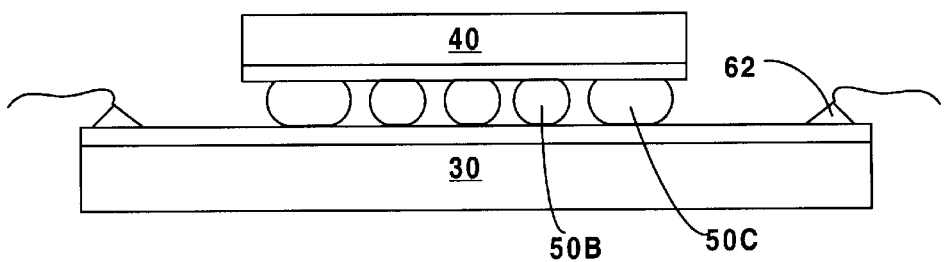

FIGS. 14 and 15 illustrate exemplary chip structures utilizing the varied C4 interconnections of the present invention. As seen in FIG. 14, a package 100 comprises a chip1/chip2 structure and substrate 20. Chip 30 is joined to chip 40 through C4 interconnections 50. C4 interconnections 50 may be of a high or low reflow temperature solder. Chip 30 is joined to the substrate 20 through a column 76, which may already be built upon the substrate, or may be a low reflow temperature solder, and joined to the chip 30 through a low or high reflow temperature solder 51. The column and other C4 interconnections may be made of solders such as lead free solders or low alpha solders, or metallic material such as copper.

FIG. 15 illustrate a chip1/chip2 structure wherein the signal outputs are joined through signal C4 interconnections 50B and the power outputs are joined through power C4 interconnections 50C. In this example, the diameters of the power C4 interconnections 50C are larger than the diameters of the signal C4 interconnections 50B, facilitating the power outputs. Other interconnections such as wirebond 62 may also be used in the structure, if desired.

Thus, the chip-on-chip interconnections according to the present invention allows for connections between devices and substrates at different levels and/or compositions.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A device comprising:

a first chip;

a second chip, wherein the second chip has a chip-thickness;

a first chip-on-chip interconnection, said first chip-on-chip interconnection having a first characteristic; and a second chip-on-chip interconnection on a same joining plane of said first chip-on-chip interconnection, said second chip-on-chip interconnection having a second characteristic, wherein said first chip-on-chip interconnection joins said first chip to said second chip on said same joining plane forming a chip-on-chip structure;

wherein said first characteristic is a first height and said second characteristic is a second height, wherein said second height is greater than said first height; and wherein the second height is not less than a sum of the chip-thickness and the first height.

2. The device of claim 1, wherein said second chip-on-chip interconnection joins said chip-on-chip structure to a planar surface of at least one of a package, substrate, a third chip, and a second device.

3. The device of claim 1, wherein said first characteristic further comprises a first composition and said second characteristic further comprises a second composition.

4. The device of claim 1, wherein at least one of said first chip-on-chip interconnection and said second chip-on-chip interconnection are plated.

5. The device of claim 1, wherein at least one of said first chip-on-chip interconnection and said second chip-on-chip interconnection includes at least one of a solder ball interconnection and a controlled collapse chip connection.

6. The device of claim 1, wherein at least one of said first chip-on-chip interconnection and said second chip-on-chip interconnection is a solder column.

7. The device of claim 1, wherein said first chip-on-chip interconnection is a controlled collapse chip connection.

8. The device of claim 1, wherein said second chip-on-chip interconnection is a controlled collapse chip connection.

9. A device comprising:

a first chip;

a second chip;

a first chip-on-chip interconnection having a first composition; and a second chip-on-chip interconnection on a same joining plane of said first chip-on-chip interconnection, said second chip-on-chip interconnection having a second composition, wherein said first chip-on-chip interconnection joins said first chip to said second chip on said same joining plane forming a chip-on-chip structure.

10. The device of claim 9, wherein said second chip-on-chip interconnection joins said chip-on-chip structure to a substrate.

11. The device of claim 9, wherein said second chip-on-chip interconnection joins said first chip to said second chip.

12. The device of claim 9, wherein said second chip-on-chip interconnection joins said chip-on-chip structure to a second device.

13. The device of claim 9, wherein said first chip-on-chip interconnection comprises a first height and said second chip-on-chip interconnection comprises a second height.

14. The device of claim 9, wherein said first chip-on-chip interconnection and said second chip-on-chip interconnection are plated.

15. The device of claim 9, wherein said first chip-on-chip interconnection is a solder ball interconnection.

16. The device of claim 9, wherein said first chip-on-chip interconnection is a solder column.

17. The device of claim 9, wherein said first chip-on-chip interconnection is a controlled collapse chip connection.

18. The device of claim 9, wherein said second chip-on-chip interconnection is a controlled collapse chip connection.

19. The device of claim 9, wherein said first chip-on-chip interconnection and said second chip-on-chip interconnection further differ in a characteristic selected from the group consisting of: height, shape, and diameter.

20. A device comprising:

a first chip;

a second chip;

a first chip-on-chip interconnection, comprising a solder column, having a first characteristic; and a second chip-on-chip interconnection on a same joining plane of said first chip-on-chip interconnection, said second chip-on-chip interconnection having a second characteristic, wherein said first chip-on-chip interconnection joins said first chip to said second chip on said same joining plane forming a chip-on-chip structure.

21. The device of claim 20 wherein said second chip-on-chip interconnection joins said chip-on-chip structure to a substrate.

22. The device of claim 20 wherein said second chip-on-chip interconnection joins said first chip to said second chip.

23. The device of claim 20 wherein said second chip-on-chip interconnection joins said chip-on-chip structure to a second device.

24. The device of claim 20, wherein said first characteristic is a first height and said second characteristic is a second height.

25. The device of claim 20, wherein said first characteristic is a first diameter and said second characteristic is a second diameter.

26. The device of claim 20, wherein said first characteristic is a first composition and said second characteristic is a second composition.

27. The device of claim 20, wherein said first chip-on-chip interconnection and said second chip-on-chip interconnection are plated.

28. A chip-on-chip package comprising:

a plurality of devices at different levels;

a first chip-on-chip interconnection having a first composition; and a second chip-on-chip interconnection having a second composition, wherein said first and said second chip-on-chip interconnections connect said plurality of devices together on a same joining plane.

29. The assembly of claim 28 wherein said first interconnection further comprises a first height and a first diameter and said second interconnection further comprises a second height and a second diameter.

30. A device comprising:

a first chip;

a second chip;

a first chip-on-chip interconnection on said first chip, said first chip-on-chip interconnection having a first characteristic;

a second chip-on-chip interconnection on a same joining plane of said first chip-on-chip interconnection, said second chip-on-chip interconnection having a second characteristic, wherein said first chip-on-chip interconnection joins said first chip to said second chip on said same joining plane forming a chip-on-chip structure;

wherein said second chip-on-chip interconnection joins said chip-on-chip structure to a planar surface;

wherein the planar surface is parallel with said joining plane; and wherein the planar surface is continuous where it is adjacent to the first chip and the second chip.

31. The device of claim 30, wherein the planar surface is one of:
- a surface of a third chip;
- a surface of a package;
- a surface of a substrate; and
- a surface of a second device.

32. The device of claim 30, wherein at least one of said first chip-on-chip interconnection and said second chip-on-chip interconnection includes at least one of a solder ball interconnection, a solder column, and a controlled collapse chip connection.

* * * * *